United States Patent
Li et al.

(10) Patent No.: US 9,653,284 B2
(45) Date of Patent: May 16, 2017

(54) THIN FILM TRANSISTOR, MANUFACTURING METHOD THEREOF AND ARRAY SUBSTRATE

(71) Applicant: BOE TECHNOLOGY GROUP CO., LTD., Beijing (CN)

(72) Inventors: Zhengliang Li, Beijing (CN); Zhen Liu, Beijing (CN); Luke Ding, Beijing (CN); Bin Zhang, Beijing (CN); Zhanfeng Cao, Beijing (CN); Guanbao Hui, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/429,059

(22) PCT Filed: Jul. 25, 2014

(86) PCT No.: PCT/CN2014/083072
§ 371 (c)(1),
(2) Date: Mar. 18, 2015

(87) PCT Pub. No.: WO2015/109802
PCT Pub. Date: Jul. 30, 2015

(65) Prior Publication Data
US 2016/0027927 A1    Jan. 28, 2016

(30) Foreign Application Priority Data
Jan. 23, 2014   (CN) .......................... 2014 1 0032607

(51) Int. Cl.
*H01L 21/338* (2006.01)
*H01L 29/00* (2006.01)
(Continued)

(52) U.S. Cl.
CPC .......... *H01L 21/02304* (2013.01); *C22C 9/00* (2013.01); *H01L 21/28008* (2013.01);
(Continued)

(58) Field of Classification Search
CPC .................. H01L 21/02304; H01L 41/0815
(Continued)

(56) References Cited

U.S. PATENT DOCUMENTS 5,429,962 A    7/1995  Yang
9,240,485 B2 *  1/2016  Liu .................. H01L 29/78606
(Continued)

FOREIGN PATENT DOCUMENTS

CN    1728403 A    2/2006
CN    101075640 A  11/2007
(Continued)

OTHER PUBLICATIONS

International Search Report of the International Searching Authority of PCT/CN2014/083072 with Notice of Transmittal of the International Search Report in Chinese, mailed Oct. 29, 2014.
(Continued)

*Primary Examiner* — Calvin Lee
(74) *Attorney, Agent, or Firm* — Collard & Roe, P.C.

(57) ABSTRACT

A thin film transistor, a manufacturing method thereof and an array substrate are provided. The thin film transistor comprises: a gate electrode (11), a source electrode (15) and a drain electrode (16), and the thin film transistor further comprises a buffer layer (11) which is directly provided at one side or both sides of at least one of the gate electrode (11), the source electrode (15) and the drain electrode (16), wherein, the buffer layer (11) and at least one of the gate electrode (11), the source electrode (15) and the drain electrode (16) directly contacting the buffer layer (11) are conformal. Therefore, the adhesion between an electrode of
(Continued)

the thin film transistor and a film layer contacting it is improved and at the same time an atom in the electrode of the thin film transistor is effectively prevented from diffusing to the film layer connected with it, and the reliability of the thin film transistor is improved and the production cost is reduced.

13 Claims, 4 Drawing Sheets

(51) Int. Cl.
    *H01L 21/02*      (2006.01)
    *H01L 41/08*      (2006.01)
    *H01L 29/49*      (2006.01)
    *H01L 29/786*      (2006.01)
    *C22C 9/00*      (2006.01)
    *H01L 21/28*      (2006.01)

(52) U.S. Cl.
    CPC .... *H01L 29/4908* (2013.01); *H01L 29/78603* (2013.01); *H01L 29/78606* (2013.01); *H01L 41/0815* (2013.01)

(58) Field of Classification Search
    USPC ...... 438/157, 180, 195, 229, 283; 257/27.69
    See application file for complete search history.

(56) References Cited

U.S. PATENT DOCUMENTS

| | | |
|---|---|---|
| 2010/0181563 A1 | 7/2010 | Kim et al. |
| 2012/0262659 A1 | 10/2012 | Takasawa et al. |
| 2013/0207114 A1 | 8/2013 | Suzuki et al. |

FOREIGN PATENT DOCUMENTS

| | | |
|---|---|---|
| CN | 101179029 A | 5/2008 |
| CN | 102956715 A | 3/2013 |
| CN | 103219389 A | 7/2013 |
| CN | 103794651 A | 5/2014 |
| JP | H06295924 A | 10/1994 |

OTHER PUBLICATIONS

Written Opinion of the International Searching Authority of PCT/CN2014/083072 in Chinese with English translation, mailed Oct. 29, 2014.

Chinese Office Action in Chinese Application No. 201410032607.8 mailed Dec. 28, 2015 with English translation.

Third Chinese Office Action in Chinese Application No. 201410032607.8 mailed Jun. 28, 2016 with English translation.

Second Chinese Office Action in Chinese Application No. 201410032607.8 mailed Apr. 29, 2016 with English translation.

* cited by examiner

THIN FILM TRANSISTOR, MANUFACTURING METHOD THEREOF AND ARRAY SUBSTRATE

CROSS REFERENCE TO RELATED APPLICATIONS

This application is the National Stage of PCT/CN2014/083072 filed on Jul. 25, 2014, which claims priority under 35 U.S.C. §119 of Chinese Application No. 201410032607.8 filed on Jan. 23, 2014, the disclosure of which is incorporated by reference.

TECHNICAL FIELD

Embodiments of the present invention relate to a thin film transistor, a manufacturing method thereof and an array substrate.

BACKGROUND

A liquid crystal display is provided with a thin film transistor (TFT) on a substrate, and the TFT is one of key parts of the liquid crystal display and has great influence on the operation performance of a display device. Each pixel unit in the liquid crystal display is driven by the TFT provided therein, and then high-speed, high-brightness and high-contrast display can be achieved.

Recently, low-resistance copper film starts to be used as an electrode of the TFT and a wiring in a semiconductor integrated circuit, the liquid crystal display and etc., and due to the low resistance of copper, the transmission speed of digital signal can be improved and power consumption can be lowered. However, the adhesion between the copper film and a semiconductor active layer in the TFT is poor, and additionally, a copper atom in the copper film may diffuse to the semiconductor active layer contacting it, this affects the characteristics of the semiconductor active layer. In addition, the adhesion between the copper film and a base substrate and an insulating layer is also poor, during actual use, the copper fill will easily fall off, and then the service life of the product is shortened.

Therefore, the reliability of the TFT will be lowered when the low-resistance copper film is used to make the electrode of the TFT.

SUMMARY

Embodiments of the present invention provide a thin film transistor, a manufacturing method thereof and an array substrate, which can improve the adhesion between an electrode of the TFT and a film layer connected with it and at the same time effectively prevent an atom in the electrode of the TFT from diffusing to the film layer connected with it, improve the reliability of the TFT and reduce the production cost.

According to an aspect, an embodiment of the present invention provides a thin film transistor, comprising: a gate electrode, a source electrode and a drain electrode, and the TFT further comprising a buffer layer which is directly provided at one side or both sides of at least one of the gate electrode, the source electrode and the drain electrode, wherein, the buffer layer and the at least one of the gate electrode, the source electrode and the drain electrode directly contacting the buffer layer are conformal.

According to another aspect, an embodiment of the preset invention further provides an array substrate comprising scan lines and data lines, crossed each other; and a plurality of pixel units, defined by the scan lines and the data lines crossed each other, wherein, each of the plurality of pixel units comprises the above described thin film transistor.

According to still another aspect, an embodiment of the present invention further provides a manufacturing method of a TFT, comprising a method of fabricating a gate electrode, a source electrode and a drain electrode, and the method further comprises: directly forming a buffer layer at one side or both sides of at least one of the gate electrode, the source electrode and the drain electrode, wherein, during etching, the buffer layer and the gate electrode, the source electrode and/or the drain electrode directly contacting it are conformally formed by using a same etching solution.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiments of the present invention provide a thin film transistor, a manufacturing method thereof and an array substrate, which can improve the adhesion between an electrode of a thin film transistor (TFT) and a film layer connected with it and at the same time effectively prevent an atom in the electrode of the TFT from diffusing to the film layer connected with it, thus improve the reliability of the TFT and reduce the production cost.

The thin film transistor provided by the embodiments of the present invention comprises: a gate electrode, a source electrode and a drain electrode, wherein the TFT further comprises a buffer layer which is directly provided at one side or both sides of at least one of the gate electrode, the source electrode and the drain electrode, and the buffer layer and at least one of the gate electrode, the source electrode and the drain electrode directly contacting the buffer layer are conformal and are obtained by etching using the same etching solution.

Detailed description of technical solution provided by the embodiments of the present invention will be given hereinafter.

The following description takes a bottom gate type TFT as an example, while the embodiments of the present invention do not define the type of the TFT, and the TFT according to the embodiments of the present invention can also be a top gate type TFT.

A First Embodiment

Figure 1:
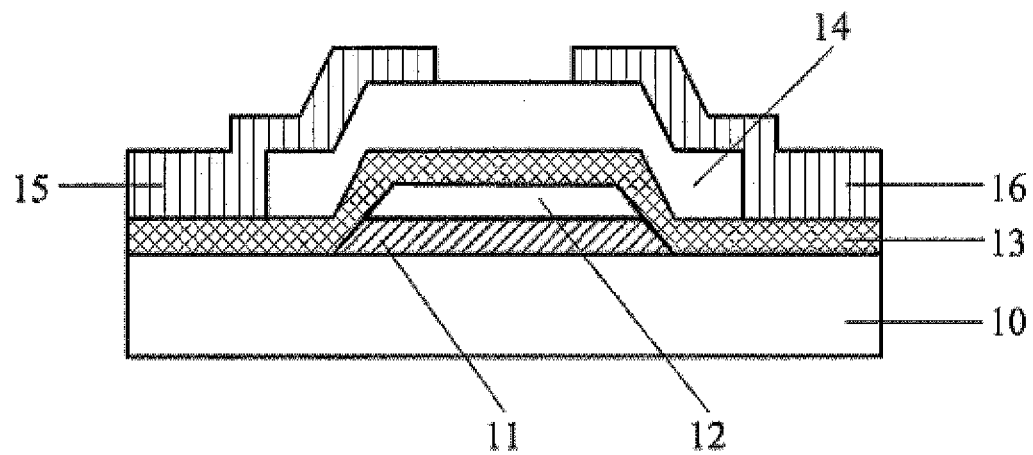
FIG. 1 is a schematic cross-sectional structural view of a TFT provided by a first embodiment of the present invention in which a buffer layer is provided at one side of a gate electrode.

As shown in FIG. 1, the first embodiment of the present invention provides a TFT, comprising: a gate electrode 12, positioned above a base substrate 10, for example, a glass substrate 10; a gate insulating layer 13, on the gate electrode 12; a semiconductor active layer 14, on the gate insulating layer 13; a source electrode 15 and a drain electrode 16, on the semiconductor active layer 14, wherein, the TFT further comprises a buffer layer 11 between the gate electrode 12 and the base substrate 10. Also, the gate electrode 12 and the buffer layer 11 are conformally formed. Herein, the gate electrode 12 contains metal Cu, and the gate electrode 12, for example, is a single-layered metal electrode formed of copper or a multi-layered metal electrode comprising metal Cu and other metals such as Mo, Al, Ni and etc. As the electrode contains a copper atom, problems caused by adhesion and diffusion of the copper atom will occur during actual use, thus, the buffer layer 11 is formed between the gate electrode 12 and the base substrate 10. Alternatively, the buffer layer 11 may also be formed between the gate electrode 12 and the gate insulating layer 13.

Exemplarily, the source electrode 15 and the drain electrode 16 may be a single-layered metal electrode formed of copper or a multi-layered metal electrode comprising metal Cu and other metals such as Mo, Al, Ni and etc. The semiconductor active layer 14 may contain amorphous silicon (a-Si) and doped amorphous silicon (n+ a-Si), wherein, there is excellent ohmic contact between the n+ a-Si and a metal.

Exemplarily, material of the buffer layer 11 in an embodiment of the present invention may be alloy material, for example, the alloy material is $Cu_aX_bN_c$, wherein X represents a non-copper metal element, for example, X is at least one of Ca, Mg, Li, Ge, Sr and Ba, the mass percentage of the metal element X is 0.05%-30%, the mass percentage of N is 0.05%-30%, and the remaining is Cu, wherein each of a, b and c is positive integer larger than 1 and is determined according to the mass percentages of Cu, X and N, and specific examples are not given herein. Therefore, the adhesion between the $Cu_aX_bN_c$ buffer layer and the base substrate according to an embodiment of the present invention is excellent, and thus, the $Cu_aX_bN_c$ buffer layer is not easily stripped, and it has good blocking effect on the copper atom and can block the diffusion of the copper atom.

Alternatively, as the gate electrode 12, the source electrode 15 and the drain electrode 16 according to an embodiment of the present invention are single-layered metal electrodes formed of metal copper, or multi-layered metal electrodes comprising copper and other metals, it is difficult for the copper film to be dry etched and the copper film is usually wet etched, the buffer layer according to an embodiment of the present invention may be etched by using the same etching solution as the gate electrode, the source electrode and/or the drain electrode during etching; thus, during actual production, only through one etching process, the buffer layer at one side or both sides of the gate electrode and the gate electrode may be etched at the same time, or the buffer layer at one side or both sides of the source electrode and the drain electrode and the source electrode and the drain electrode may be etched at the same time, thereby one etching process is saved and the production cost can be lowered.

In addition, the first embodiment of the present invention further provides a manufacturing method of a TFT, comprising: preparing a base substrate, forming a gate insulating layer, forming a semiconductor active layer, and forming a source electrode and a drain electrode, wherein, the gate insulating layer, the semiconductor active layer, the source electrode and the drain electrode are formed with common methods known to an inventor, which is omitted herein. In addition, the manufacturing method of the TFT according to the embodiment of the present invention further comprises: fabricating the buffer layer 11 and forming the gate electrode 12. The TFT manufactured according to the manufacturing method of the TFT is shown in FIG. 1.

Exemplarily, in the embodiment of the present invention, the buffer layer 11 and the gate electrode 12 are formed through one patterning process, and fabricating the buffer layer 11 and forming the gate electrode 12 comprises; placing the base substrate 10 in a magnetron sputtering apparatus, wherein a sputtering target mainly comprises Cu and further comprises at least one alloy element of Ca, Mg, Li, Ge, Sr, Ba and etc., the mass percentage of the metal copper element in the alloy element sputtering target is larger than 70%; by sputtering the alloy target in vacuum in which nitrided gas is introduced, deposition is conducted on the base substrate to obtain a buffer material layer, and the component of the buffer material layer is $Cu_aX_bN_c$, wherein X is at least one of Ca, Mg, Li, Ge, Sr and Ba, the introduced nitrided gas is $N_2$ or $NH_3$, and during depositing the buffer material layer, the flow ratio of the introduced nitrided gas in a gas mixture of the nitrided gas and other gases, for example, the gas mixture of $N_2$ and argon gas, is 1%-30%; forming a gate metal layer on the buffer material layer; performing one patterning process to the gate metal layer and the buffer material layer, wherein the same etching solution is used to etch the gate metal layer and the buffer material layer to form the gate electrode and the buffer layer at the same time.

Exemplarily, the one patterning process according to the embodiment of the present invention usually comprises coating photoresist, exposing, developing, etching and stripping the photoresist and etc., and common methods known to by the inventor may be used, and the embodiment of the present invention does not detail this herein.

Exemplarily, in the embodiment of the present invention other sputtering methods other than the magnetron sputtering may be used to form the buffer material layer, and the embodiment of the present invention does not specifically limit the apparatus used during fabricating the buffer layer.

A Second Embodiment

Figure 2:
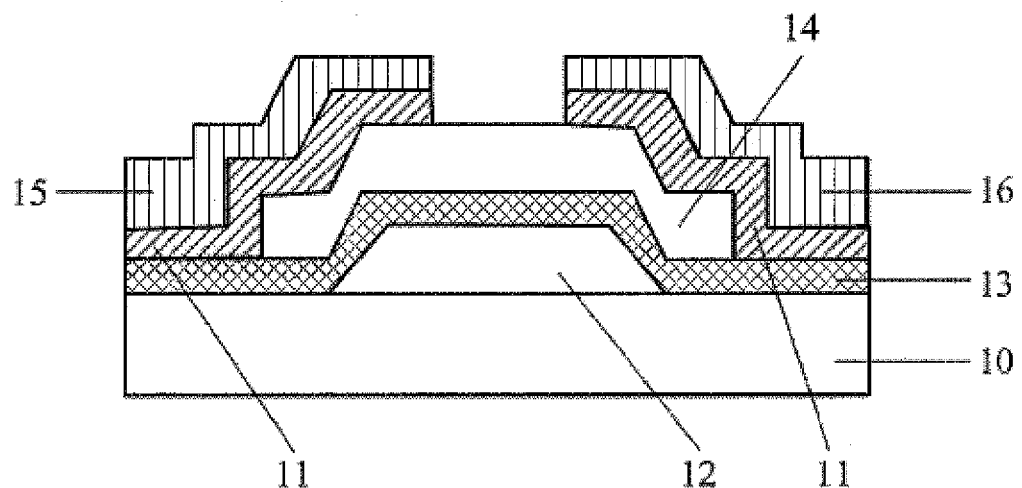
FIG. 2 is a schematic cross-sectional structural view of a TFT provided by a second embodiment of the present invention in which a buffer layer is provided at one side of a source electrode and a drain electrode.

As shown in FIG. 2, the second embodiment of the present invention provides a TFT, comprising: a gate electrode 12, on a base substrate 10, for example, a glass substrate 10; a gate insulating layer 13, on the gate electrode 12; a semiconductor active layer 14, on the gate insulating layer 13; a source electrode 15 and a drain electrode 16, above the semiconductor active layer 14, wherein, the TFT further comprises a buffer layer 11 between the source electrode 15 and the semiconductor active layer 14 and the buffer layer 11 between the drain electrode 16 and the semiconductor active layer 14. Also, the source electrode and the buffer layer are conformally formed and the drain electrode and the buffer layer are conformally formed. In FIG. 2 the gate electrode 12, the source electrode 15 and the drain electrode 16 contain metal Cu. Exemplarily, the gate electrode 12, the source electrode 15 and the drain electrode 16 may be a single-layered metal electrode formed of metal Cu or a multi-layered metal electrode comprising metal Cu and other metals such as Mo, Al, Ni and etc. As the electrode contains the copper, problems caused by adhesion and diffusion of the copper atom will occur during actual use, thus, the buffer layer 11 is formed between the source electrode 15 and the semiconductor layer 14 and between the drain electrode 16 and the semiconductor active layer 14, of course, the buffer layer 11 may also be formed between the source electrode 15 and an insulating layer subsequently formed and between the drain electrode 16 and an insulating layer subsequently formed.

Exemplarily, material of the buffer layer 11 in an embodiment of the present invention may be alloy material, for example, the alloy material is $Cu_aX_bN_c$, wherein X represents a non-copper metal element, for example, X is at least one of Ca, Mg, Li, Ge, Sr and Ba, the mass percentage of the metal element X is 0.05%-30%, the mass percentage of N is 0.05%-30%, and the remaining is Cu, wherein each of a, b and c is positive integer larger than 1 and is determined according to the mass percentages of Cu, X and N, and specific examples are not given herein.

Alternatively, the second embodiment of the present invention further provides a method of manufacturing the TFT as shown in FIG. 2, comprising: preparing a base substrate, forming a gate electrode, forming a gate insulating layer and forming a semiconductor active layer, wherein, the gate electrode, the gate insulating layer and the semiconductor active layer may be formed with common methods known to by the inventor, which is omitted herein. In addition, the method of manufacturing the TFT according to the embodiment of the present invention further comprises: fabricating the buffer layer 11 and forming the source electrode and the drain electrode.

Exemplarily, in the embodiment of the present invention, fabricating the buffer layer 11 and forming the source electrode and the drain electrode are performed through one patterning process, and fabricating the buffer layer 11 and forming the source electrode and the drain electrode comprises: placing the base substrate formed with the semiconductor active layer in a magnetron sputtering apparatus, wherein a sputtering target mainly comprises Cu and further comprises at least one alloy element of Ca, Mg, Li, Ge, Sr, Ba and etc., the mass percentage of the metal copper element in the alloy element sputtering target is larger than 70%; by sputtering the alloy target in vacuum in which nitrided gas is introduced, deposition is conducted on the base substrate formed with the semiconductor active layer to obtain a buffer material layer, and the component of the buffer material layer is $Cu_aX_bN_c$, wherein X is at least one of Ca, Mg, Li, Ge, Sr and Ba, the introduced nitrided gas is $N_2$ or $NH_3$, and during depositing the buffer material layer, the flow ratio of the introduced nitrided gas in a gas mixture of the nitrided gas and other gases, for example, the gas mixture of $N_2$ and argon gas, is 1%-30%; forming a source/drain metal layer on the buffer material layer; performing one patterning process to the source/drain metal layer and the buffer material layer, wherein the same etching solution is used to etch the source/drain metal layer and the buffer material layer to form the source electrode, the drain electrode and the buffer layer at the same time.

In this embodiment, the adhesion between the $Cu_aX_bN_c$ buffer layer and the semiconductor active layer is relatively excellent, and thus, the $Cu_aX_bN_c$ buffer layer is not easily stripped and has good blocking effect on a copper atom, thereby can effectively prevent the copper atom from diffusing into the semiconductor active layer.

Exemplarily, in the embodiment of the present invention other sputtering methods other than the magnetron sputtering may be used to form the buffer material layer, and the embodiment of the present invention does not specifically limit the apparatus used during fabricating the buffer layer.

A Third Embodiment

Figure 3:
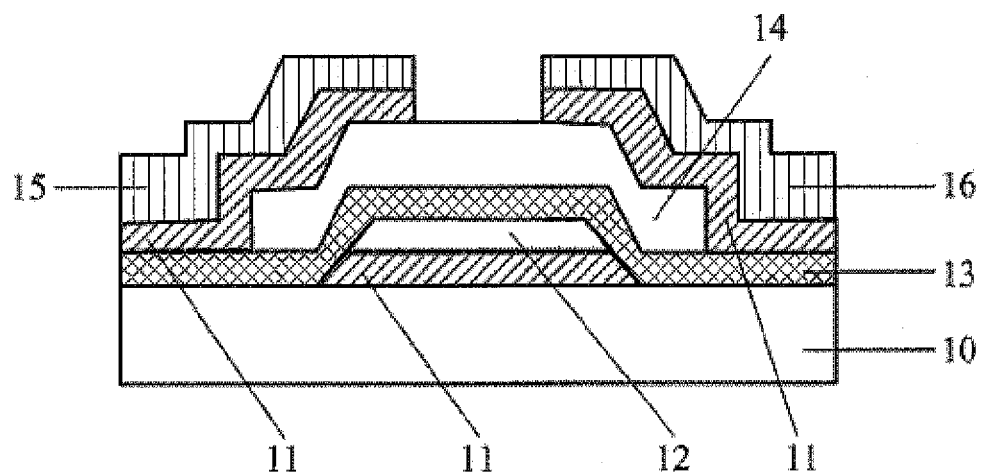
FIG. 3 is a schematic cross-sectional structural view of a TFT provided by a third embodiment of the present invention in which a buffer layer is provided at one side of a gate electrode, a source electrode and a drain electrode.

As shown in FIG. 3, the third embodiment of the present invention further provides a TFT, comprising: a gate electrode 12, above a base substrate 10, for example, a glass substrate 10; a gate insulating layer 13, on the gate electrode 12; a semiconductor active layer 14, on the gate insulating layer 13; a source electrode 15 and a drain electrode 16, above the semiconductor active layer 14, wherein, the TFT further comprises a buffer layer 11 between the gate electrode 12 and the base substrate 10, the buffer layer 11 between the source electrode 15 and the semiconductor active layer 14, and the buffer layer 11 between the drain electrode 16 and the semiconductor active layer 14. Alternatively, the buffer layer 11 may also be located between the gate electrode 12 and the gate insulating layer 13, between the source electrode 15 and an insulating layer subsequently formed, and between the drain electrode 16 and an insulating layer subsequently formed. Material of the buffer layer 11 in FIG. 3 is also CuXN and is manufactured with a method similar to the manufacturing method of the buffer layer in FIGS. 1 and 2, which is omitted herein.

Herein, the buffer layer and the gate electrode 12, the source electrode 15 and the drain electrode 16 directly contacting the buffer layer are conformally formed.

Figure 4:
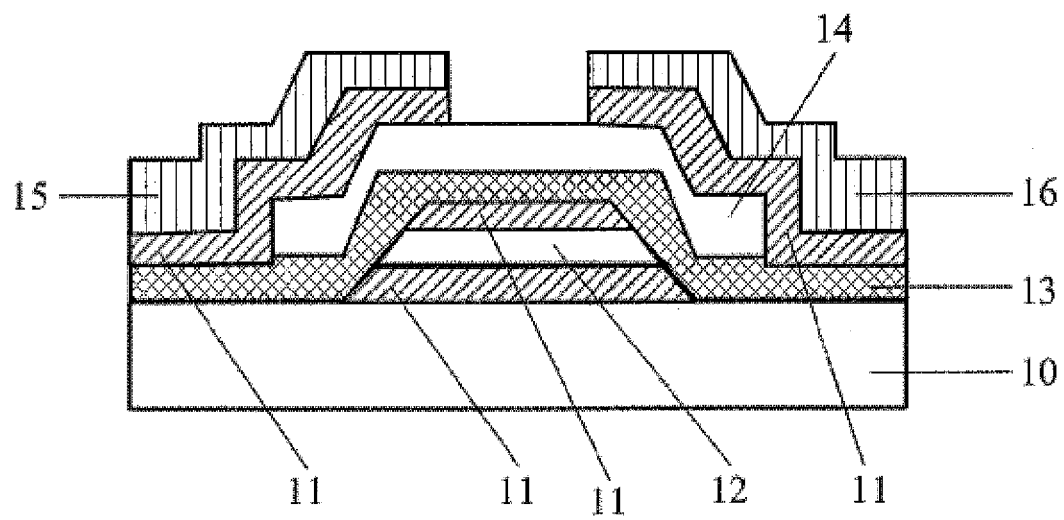
FIG. 4 is a schematic cross-sectional structural view of a TFT provided by an embodiment of the present invention in which a buffer layer is provided at two sides of a gate electrode.
Figure 5:
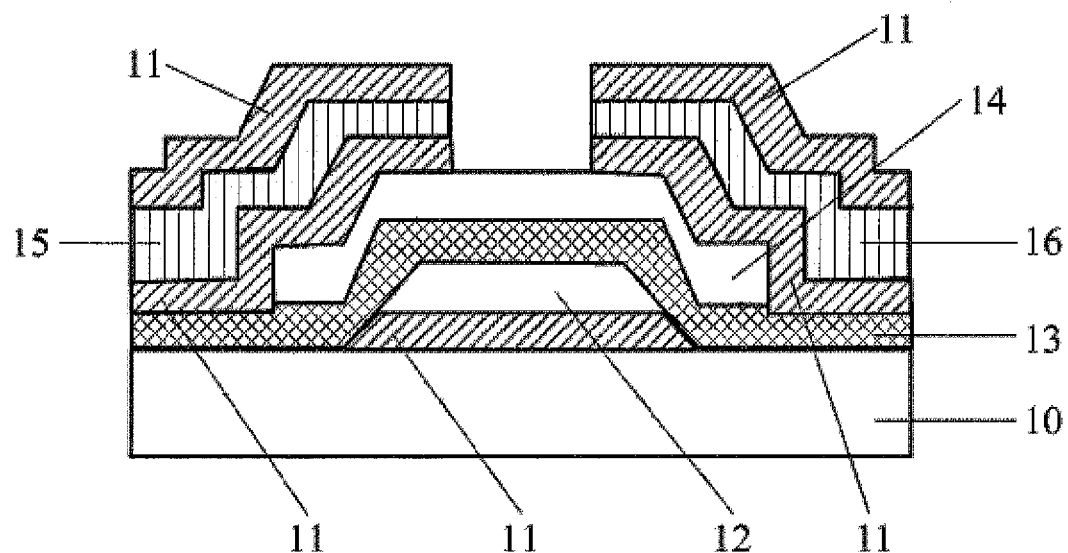
FIG. 5 is a schematic cross-sectional structural view of a TFT provided by an embodiment of the present invention in which a buffer layer is provided at two sides of a source electrode and a drain electrode.
Figure 6:
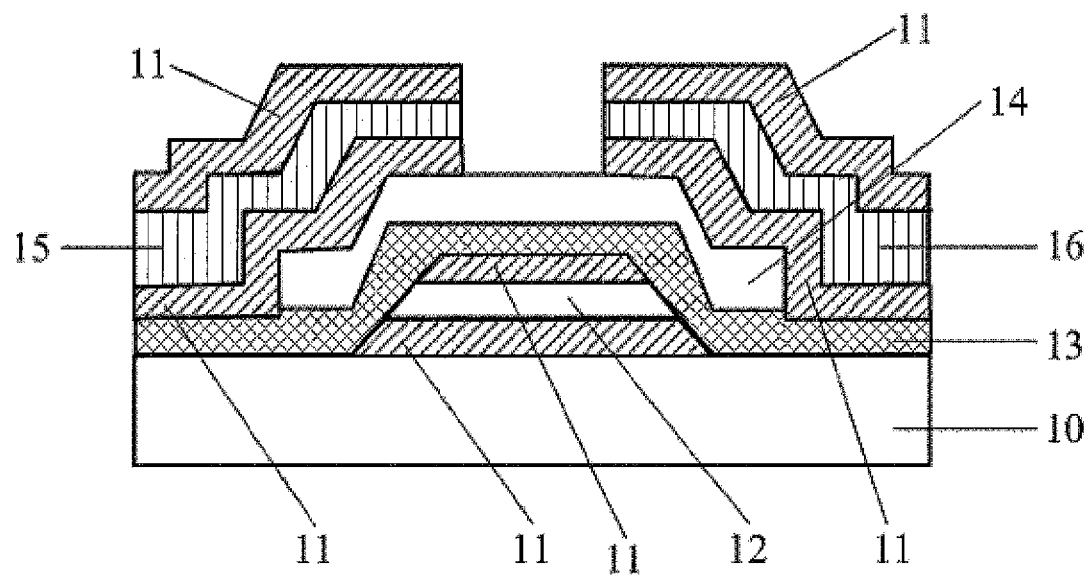
FIG. 6 is a schematic cross-sectional structural view of a TFT provided by an embodiment of the present invention in which a buffer layer is provided at two sides of a gate electrode, a source electrode and a drain electrode.

Alternatively, the buffer layers in FIGS. 1, 2 and 3 are all located at one side of the gate electrode and/or the source electrode and the drain electrode, and the buffer layer may also be located at both sides of the gate electrode and/or the source electrode and the drain electrode, as shown in FIG. 4, the buffer layer 11 is located at both sides of the gate electrode 12; as shown in FIG. 5, the buffer layer 11 is located at both sides of the source electrode and the drain electrode; as shown in FIG. 6, the buffer layer is located at both sides of source electrode and the drain electrode and at both sides of the gate electrode 12 at the same time. The situation in which the buffer layer is located at both sides of the gate electrode and/or the source electrode and the drain electrode is similar to the situation in which the buffer layer is located at one side of the gate electrode and/or source electrode and the drain electrode, which is omitted herein.

Figure 7:
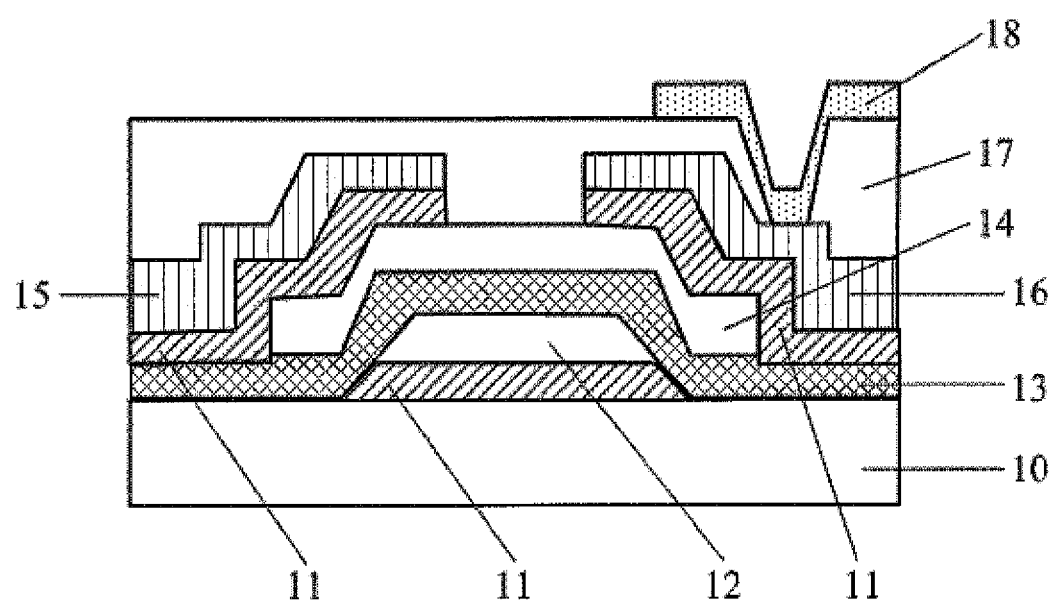
FIG. 7 is a schematic cross-sectional structural view of an array substrate provided by an embodiment of the present invention.

Alternatively, an embodiment of the present invention further provides an array substrate, as shown in FIG. 7, the array substrate comprises scan lines (not shown in the figure) and data lines (not shown in the figure) intersecting each other, and an insulating layer 17 and a pixel electrode 18, wherein material of the pixel electrode 18 is, for example, ITO (indium tin oxide). Herein, the scan lines and data lines intersecting each other define a plurality of pixel units each of which comprises the TFT according to any embodiment of the present invention.

Exemplarily, the array substrate according to the embodiment of the present invention may further comprise a buffer layer located at one side or both sides of the scan line, and material of the buffer layer is alloy material. Exemplarily, in the embodiments of the present invention the alloy material is $Cu_aX_bN_c$, wherein X represents a non-copper metal element, for example, X is at least one of Ca, Mg, Li, Ge, Sr and Ba, the mass percentage of the metal element X is 0.05%-30%, the mass percentage of N is 0.05%-30%, and the remaining is Cu, wherein each of a, b and c is positive integer larger than 1 and is determined according to the mass percentages of Cu, X and N, and specific examples are not given herein. Material of the scan lines according to the embodiments of the present invention is metal copper, due to the low resistance of the metal copper, the embodiments of the present invention can effectively reduce the resistance of the scan lines. In the embodiments of the present invention, the buffer layer at one side or both sides of the scan line of the array substrate has good blocking effect on Cu atoms and can prevent diffusion of copper atoms in the scan lines. Meanwhile, in the embodiments of the present invention, during etching, the buffer layer may be etching by using the same etching solution as the scan line, thus, during actual production, only through one etching process, the buffer layer and the scan lines can be formed at the same time, thereby one etching process is saved and the production cost can be lowered.

Alternatively, the array substrate according to the embodiment of the present invention may further comprise a buffer layer located at one side or both sides of the data lines, and material of the buffer layer is alloy material, and the alloy material is, for example, $Cu_aX_bN_c$, wherein X represents a non-copper metal element, for example, X is at least one of Ca, Mg, Li, Ge, Sr and Ba, the mass percentage of the metal element X is 0.05%-30%, the mass percentage of N is 0.05%-30%, and the remaining is Cu, wherein each of a, b and c is positive integer larger than 1 and is determined according to the mass percentages of Cu, X and N, and specific examples are not given herein. Herein material of the data line is metal copper, due to the low resistance of the metal copper, the embodiments of the present invention can effectively lower the resistance of the data line and then can reduce power consumption. In addition, in the embodiments of the present invention, the buffer layer at one side or both sides of the data line of the array substrate has good blocking effect on Cu atoms and can prevent diffusion of copper atoms in the data line. Meanwhile, in the embodiments of the present invention, during etching, the buffer layer may be etched by using the same etching solution as the data line, thus, during actual production, only through one etching process, the buffer layer and the data line can be formed at the same time, thereby one etching process is saved and the production cost can be lowered.

In a TFT, a manufacturing method thereof and an array substrate according to embodiments of the present invention, by sputtering an alloy target in vacuum in which nitrided gas is introduced, the buffer layer is formed at one side or both sides of at least one of the gate electrode, the source electrode and the drain electrode, wherein, during etching, the buffer layer may be etched by using the same etching solution as at least one of the gate electrode, the source electrode and the drain electrode, thus the adhesion between the gate electrode, the source electrode and the drain electrode of the TFT and a film layer connected with it can be improved and at the same time diffusion of atoms in the source electrode, the gate electrode and the drain electrode of the TFT to the film layer connected with it is effectively prevented, and then the reliability of the TFT is improved and the production cost is lowered.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The present application claims the priority of the Chinese patent application. No. 201410032607.8 filed on Jan. 23, 2014, which is herein incorporated on its entirety as a part of the present application.

The invention claimed is:

1. A thin film transistor, comprising:
a gate electrode, a source electrode and a drain electrode, and the TFT further comprising a buffer layer which is directly provided at one side or both sides of at least one of the gate electrode, the source electrode and the drain electrode,
wherein, the buffer layer and the at least one of the gate electrode, the source electrode and the drain electrode directly contacting the buffer layer are conformal, and wherein
material of the buffer layer is alloy material, the alloy material is $Cu_aX_bN_c$, wherein X represents a non-copper metal element and mass percentage of the N is 0.05%-30%.

2. The thin film transistor according to claim 1, wherein the gate electrode, the source electrode and the drain electrode contain copper.

3. The thin film transistor according to claim 1, wherein the buffer layer and the at least one of the gate electrode, the source electrode and the drain electrode directly contacting the buffer layer are formed by using a same etching solution.

4. The thin film transistor according to claim 1, wherein mass percentage of the element X is 0.05%-30%.

5. The thin film transistor according to claim 4, wherein the element X is at least one of Ca, Mg, Li, Ge, Sr and Ba.

6. An array substrate, comprising:
scan lines and data lines, crossed each other; and
a plurality of pixel units, defined by the scan lines and the data lines crossed each other,
wherein each of the plurality of pixel units comprises the thin film transistor according to claim 1.

7. The array substrate according to claim 6, wherein the array substrate further comprises a buffer layer directly provided at one side or both sides of the scan lines.

8. The array substrate according to claim 6, wherein the array substrate further comprises a buffer layer directly provided at one side or both sides of the data lines.

9. A method of manufacturing the thin film transistor according to claim 1, comprising a method of fabricating a gate electrode, a source electrode and a drain electrode, and the method further comprises:

directly forming a buffer layer at one side or both sides of at least one of the gate electrode, the source electrode and the drain electrode, wherein during etching, the buffer layer and the gate electrode, the source electrode and/or the drain electrode directly contacting it are conformally formed by using a same etching solution, wherein material of the buffer layer is $Cu_aX_bN_c$, and X represents a non-copper metal element and mass percentage of the N is 0.05%-30%.

10. The method according to claim 9, wherein the forming the buffer layer comprises:

placing a base substrate in a magnetron sputtering device;

by sputtering an alloy target in vacuum in which nitrided gas is introduced, conducting deposition on the base substrate to obtain a buffer material layer;

forming a gate metal layer on the buffer material layer;

performing one patterning process to the gate metal layer and the buffer material layer, wherein a same etching solution is used to etch the gate metal layer and the buffer material layer to form the gate electrode and the buffer layer at the same time.

11. The method according to claim 9, wherein the forming the buffer layer comprises:

placing a base substrate in a magnetron sputtering device;

by sputtering an alloy target in vacuum in which nitrided gas is introduced, conducting deposition on the base substrate to obtain a buffer material layer;

forming a gate metal layer on the buffer material layer;

placing the base substrate formed with the gate metal layer in the magnetron sputtering device;

by sputtering the alloy target in vacuum in which nitrided gas is introduced;

conducting deposition on the base substrate formed with the gate metal layer to obtain another buffer material layer; and performing one patterning process to the another buffer material layer, the gate metal layer and the buffer material layer, wherein a same etching solution is used to etch the another buffer material layer, the gate metal layer and the buffer material layer to form the gate electrode and the two buffer layers at the same time.

12. The method according to claim 9, wherein the forming the buffer layer comprises: sputtering an alloy target in vacuum in which nitrided gas is introduced to form a buffer material layer; and forming the buffer layer through etching.

13. The method according to claim 12, wherein a flow ratio of the nitrided gas introduced during forming the buffer layer through sputtering is 1%-30%.

* * * * *